US008460948B2

(12) United States Patent
Matsumoto

(10) Patent No.: US 8,460,948 B2
(45) Date of Patent: Jun. 11, 2013

(54) METHOD FOR MANUFACTURING LIQUID EJECTING HEAD

(75) Inventor: Yasuyuki Matsumoto, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/438,150

(22) Filed: Apr. 3, 2012

(65) Prior Publication Data

US 2012/0258556 A1 Oct. 11, 2012

(30) Foreign Application Priority Data

Apr. 6, 2011 (JP) ................................ 2011-084672

(51) Int. Cl.
*H01L 21/3213* (2006.01)

(52) U.S. Cl.
USPC ...... 438/21; 438/700; 438/705; 257/E21.235; 216/2; 216/27

(58) Field of Classification Search
USPC ... 438/21, 700, 705, FOR. 388; 257/E21.235; 216/2, 27
See application file for complete search history.

(56) References Cited

U.S. PATENT DOCUMENTS

| | | | | |
|---|---|---|---|---|
| 4,047,184 | A * | 9/1977 | Bassous et al. | 347/76 |
| 7,368,063 | B2 * | 5/2008 | Kim et al. | 216/27 |
| 2010/0285617 | A1 * | 11/2010 | Saito et al. | 438/21 |
| 2012/0258556 | A1 * | 10/2012 | Matsumoto | 438/21 |

FOREIGN PATENT DOCUMENTS

JP 2007-261215 10/2007

* cited by examiner

*Primary Examiner* — George Fourson, III
(74) *Attorney, Agent, or Firm* — Workman Nydegger

(57) ABSTRACT

A method for manufacturing an ink jet recording head is employed which has a metal mask formation process for forming a metal mask having a predetermined shape containing a silicide film formed by silicidation of the surface of a flow path forming substrate wafer containing a silicon substrate and a liquid flow path formation process for forming a liquid flow path by anisotropically etching the flow path forming substrate wafer using the metal mask as a mask.

5 Claims, 7 Drawing Sheets

METHOD FOR MANUFACTURING LIQUID EJECTING HEAD

This application claims a priority to Japanese Patent Application No. 2011-084672 filed on Apr. 6, 2011 which is hereby expressly incorporated by reference herein in its entirety.

BACKGROUND

1. Technical Field

The present invention relates to a method for manufacturing a liquid ejecting head.

2. Related Art

Mentioned as a liquid ejecting apparatus having a liquid ejecting head is, for example, an ink jet recording apparatus provided with an ink jet recording head having a plurality of pressure generating chambers which generate pressure for ejecting ink droplets by a piezoelectric element or a heat generating element, a common reservoir which supplies ink to each pressure generating chamber, and a nozzle opening communicating with each pressure generating chamber. The ink jet recording apparatus is configured so that a discharge energy is applied to ink in the pressure generating chamber communicating with a nozzle corresponding to a printing signal to discharge the ink from the nozzle opening.

JP-A-2007-261215 discloses a method for manufacturing an ink jet recording head. According to the manufacturing method, a plurality of piezoelectric element materials are formed into films on one surface side of a flow path forming substrate containing a silicon substrate to thereby form a piezoelectric element, a reservoir forming substrate having a reservoir portion is joined to the one surface side of the flow path forming substrate, and thereafter a mask having a predetermined shape is formed on the other side of the flow path forming substrate and anisotropic etching is performed, thereby forming a liquid flow path containing pressure generating chambers and a communication portion.

In the former technique, silicon nitride ($Si_3N_4$) in which a size variation due to undercutting during etching is smaller than that of silica dioxide ($SiO_2$) is employed as the mask in the anisotropic etching technique. The mask has a small film thickness and patterning is performed by dry etching, and therefore the dimension accuracy is good.

However, in order to remove a mask film in the shape of eaves generated after the anisotropic etching, it is necessary to perform wet etching, and phosphoric acid ($H_3PO_4$) is used as an etchant therefor. Phosphoric acid has a risk of damaging an adhesive or the like for joining the substrates, and therefore can cause a reduction in the head quality. In order to avoid the risk, a measure for lowering the wet etching temperature can also be taken. However, the treatment time is prolonged, and therefore mass productivity is poor.

Therefore, it has been desired to employ another new mask in the anisotropic etching technique.

SUMMARY

An advantage of some aspects of the invention is to provide a method for manufacturing a liquid ejecting head capable of securing dimension accuracy and improving the quality.

In order to solve the above-described problems, the invention employs a method for manufacturing a liquid ejecting head having a metal mask formation process for forming a metal mask having a predetermined shape containing a silicide film formed by silicidation of the surface of a silicon substrate and a liquid flow path formation process for forming a liquid flow path by anisotropically etching the silicon substrate using the metal mask as a mask.

By employing such a technique, the invention employs a metal mask containing a silicide film obtained by silicidation of the surface of a silicon substrate as a mask for anisotropic etching. Since the silicide film firmly combines the metal mask and the silicon substrate with a molecular level, side etching can be almost completely suppressed and high dimension accuracy is obtained in the liquid flow path.

The invention employs a technique such that the metal mask contains a nickel silicide film as the silicide film.

By employing such a technique, the metal mask contains a nickel silicide film which is dense and has excellent etching resistance, and therefore the thickness of the mask itself can be sharply reduced. Moreover, the treatment time for removing the mask material can be shortened and damages on an adhesive for joining the substrates can be sharply reduced.

The invention employs a technique such that the metal mask formation process includes a silicide film formation process for forming a predetermined metal film on the surface of the silicon substrate to form the silicide film and a patterning process for patterning the silicide film into a predetermined shape.

By employing such a technique, the invention has, in the formation of the metal mask, a process for forming a metal film on the surface of a silicon substrate to form a silicide film and a process for patterning the silicide film.

The invention employs a technique such that the silicide film formation process includes forming the metal film by an electron cyclotron resonance sputtering method.

In the invention, by employing such a technique, the metal film is formed by an electron cyclotron resonance sputtering method, so that metal components of the metal film can be diffused on the surface of the silicon substrate by the action of high-density plasma generated by the sputtering method to thereby form the silicide film.

The invention employs a technique such that the patterning process includes performing the patterning by a reactive ion etching method using carbon tetrafluoride as an etching gas.

In the invention, by employing such a technique, the silicide film firmly combining with a molecular level can be patterned by the use of a reactive ion etching method using carbon tetrafluoride, so that a metal mask having a predetermined shape can be formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of a method for manufacturing a liquid ejecting head according to the invention is described with reference to the drawings. In this embodiment, an ink jet recording head is described as an example as the liquid ejecting head according to the invention.

Figure 1:
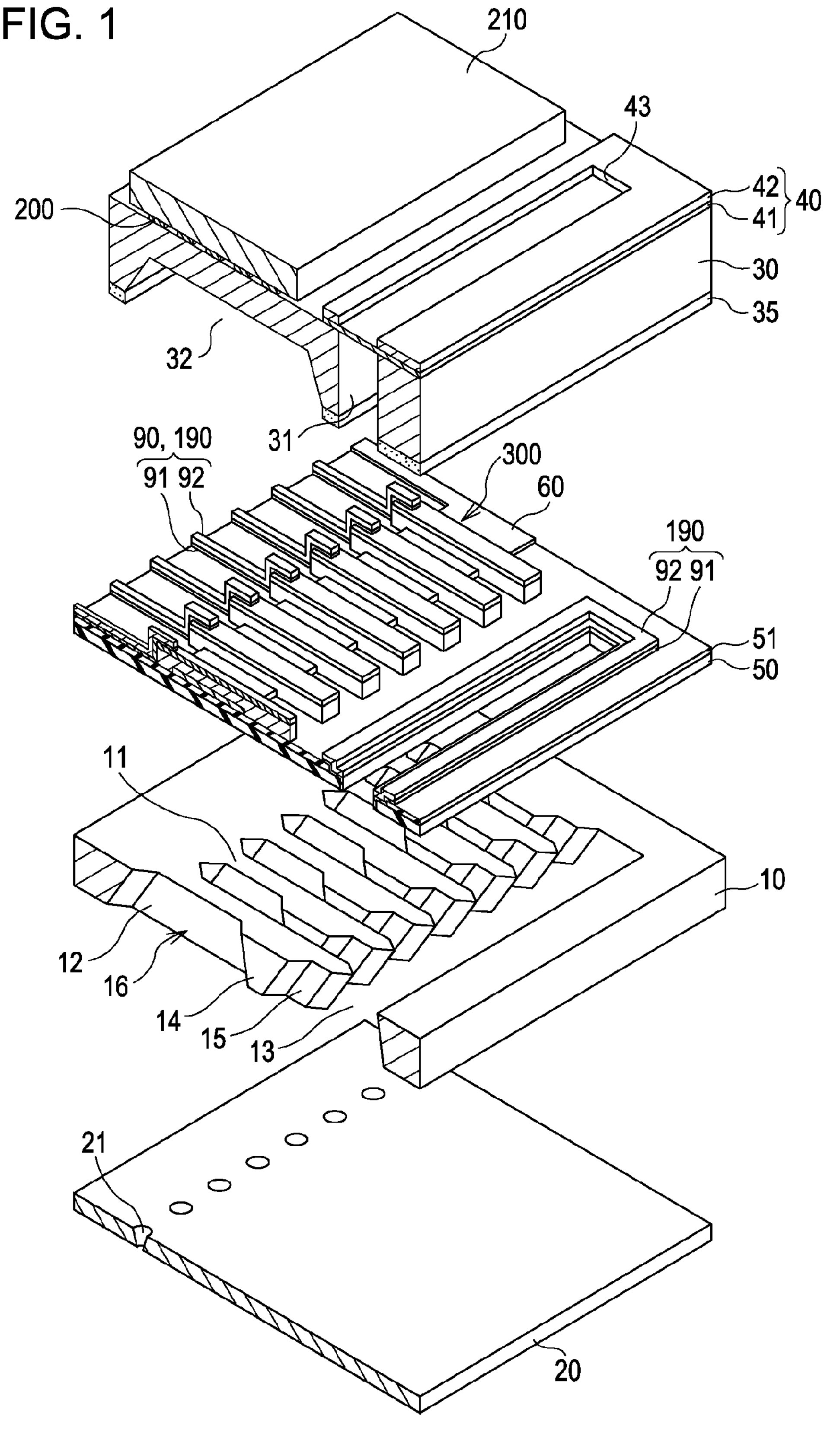
FIG. 1 is an exploded perspective view illustrating the configuration of an ink jet recording head manufactured by a manufacturing method in an embodiment of the invention.
Figure 2A:
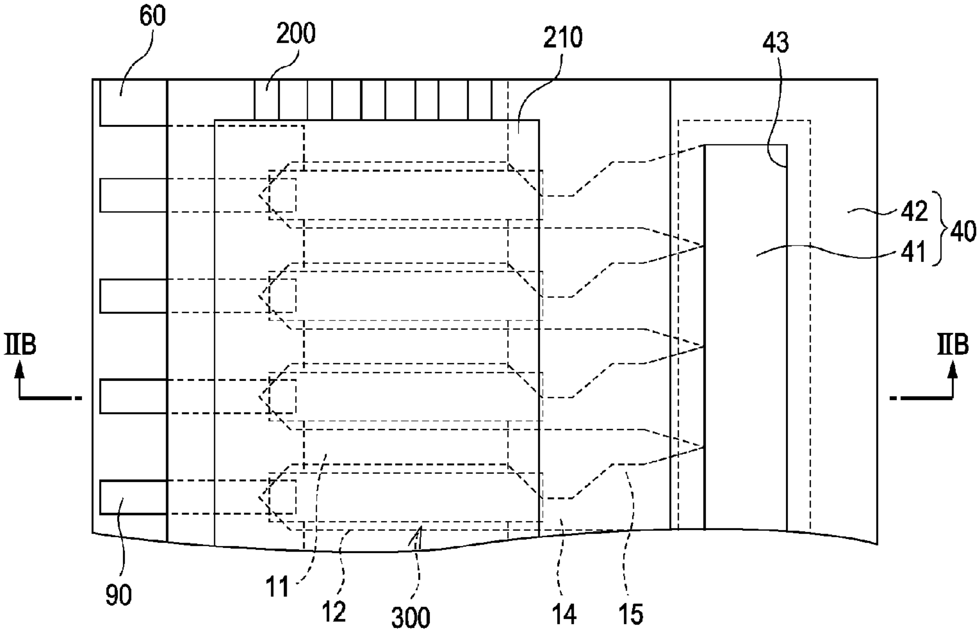
FIG. 2A is a plan view illustrating the configuration of the ink jet recording head in the embodiment of the invention.
Figure 2B:
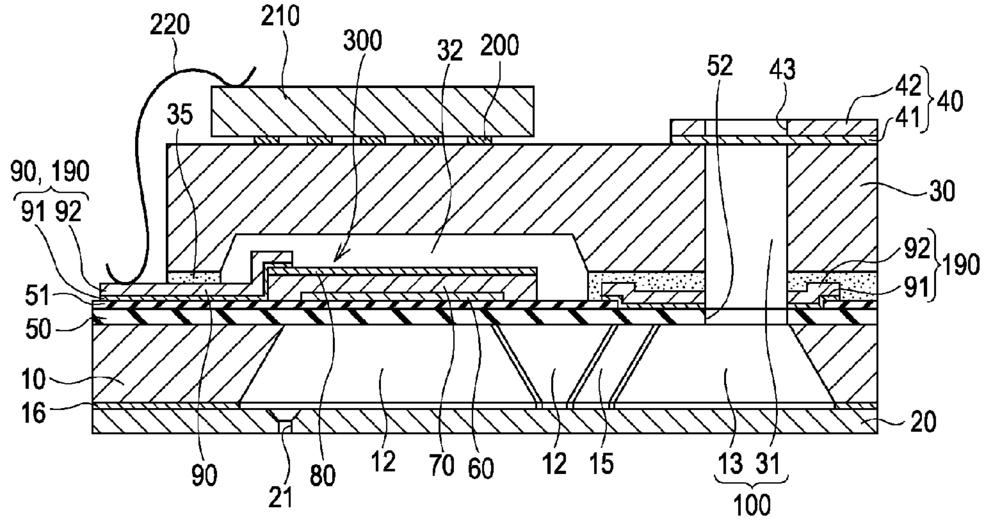
FIG. 2B is a cross sectional view illustrating the configuration of the ink jet recording head in the embodiment of the invention.

FIG. 1 is an exploded perspective view illustrating the configuration of an ink jet recording head manufactured by a manufacturing method in an embodiment of the invention. FIGS. 2A and 2B are a plan view and a cross sectional view, respectively, illustrating the configuration of the ink jet recording head in the embodiment of the invention.

As illustrated in the drawings, the ink jet recording head has a flow path forming substrate 10. In this embodiment, the flow path forming substrate 10 contains a silicon single crystal substrate in a (110) plane direction and an elastic film 50 containing silicon dioxide formed by thermal oxidation is formed on one surface of the flow path forming substrate 10.

In the flow path forming substrate 10, pressure generating chambers 12 sectioned by a plurality of partitions 11 are arranged in parallel in the width direction by performing anisotropic etching from a surface side opposite to the one surface side on which the elastic film 50 is formed. At one end portion side in the longitudinal direction of the pressure generating chambers 12 of the flow path forming substrate 10, ink supply paths 14 and communication paths 15 which constitute a liquid flow path with the pressure generating chambers 12 are sectioned by the partitions 11. At one end of the communication paths 15, a communication portion 13 is formed which constitutes a part of a reservoir 100 serving as a common ink chamber (liquid chamber) of each pressure generating chamber 12.

The ink supply path 14 communicates with one end portion side in the longitudinal direction of the pressure generating chamber 12 and has a cross sectional area smaller than that of the pressure generating chamber 12. The ink supply path 14 of this embodiment is formed with a width smaller than the width of the pressure generating chamber 12 by narrowing, in the width direction, the flow path at the side of the pressure generating chamber 12 between the reservoir 100 and each pressure generating chamber 12. Although the ink supply path 14 may be formed by reducing the width of the flow path from one side as in this embodiment, the ink supply path 14 may be formed by reducing the width of the flow path from both sides. The ink supply path 14 may be formed not by reducing the width of the flow path but by reducing the thickness thereof.

The communication path 15 is formed by extending the partitions 11 at both sides in the width direction of the pressure generating chamber 12 to the communication portion 13 and sectioning a space between the ink supply path 14 and the communication portion 13. More specifically, in the flow path forming substrate 10, the ink supply paths 14 having a cross sectional area smaller than the cross sectional area in the width direction of the pressure generating chamber 12 and the communication paths 15 communicating with the ink supply paths 14 and having a larger cross sectional area than the cross sectional area in the width direction of the ink supply path 14 are sectioned by a plurality of the partitions 11.

Onto the other surface side of the flow path forming substrate 10, a nozzle plate 20 in which nozzle openings 21 communicating with the vicinity of the end portion at a side opposite to the ink supply path 14 of each pressure generating chamber 12 are formed is adhered with an adhesive, a heat bonding film, or the like. The nozzle plate 20 contains glass ceramics, a silicon single crystal substrate, stainless steel, or the like, for example.

On the joining surface to which the nozzle plate 20 is joined, a silicide film 16 is provided. The silicide film 16 is formed with a silicide film having liquid resistance, for example, a nickel silicide film. The liquid resistance as used herein refers to etching resistance (alkali resistance). The silicide film 16 may not be provided in a region in the joining surface.

On one surface side of the flow path forming substrate 10, the elastic film 50 containing silicon dioxide is formed as described above. On the elastic film 50, an insulator film 51 containing, for example, zirconium dioxide ($ZrO_2$) or the like is laminated. On the insulator film 51, a piezoelectric element 300 containing a lower electrode film 60, a piezoelectric layer 70, and an upper electrode film 80 is formed.

Herein, the piezoelectric element 300 refers to a portion containing the lower electrode film 60, the piezoelectric layer 70, and the upper electrode film 80. In general, one electrode of the piezoelectric element 300 is used as a common electrode and the other electrode and the piezoelectric layer 70 are patterned every pressure generating chamber 12. Although the lower electrode film 60 is used as the common electrode of the piezoelectric elements 300 and the upper electrode film 80 is used as an individual electrode of the piezoelectric elements 300 in this embodiment, there arise no problems even when the configuration is reversed on the ground of the configuration a drive circuit or wiring.

To the upper electrode film 80 of each piezoelectric element 300, a lead electrode 90 constituted by a wiring layer 190 containing an adhesion layer 91 and a metal layer 92 is connected. It is configured so that a voltage is selectively applied to each piezoelectric element 300 through the lead electrode 90. Although details are described later, a wiring layer 190 which is discontinuous with the lead electrode 90 is present on a diaphragm in a region corresponding to the opening peripheral portion of the communication portion 13, i.e., on the elastic film 50 and the insulator film 51.

To one surface side of the flow path forming substrate 10, a reservoir forming substrate 30 having a reservoir portion 31 constituting a part of a reservoir 100 is joined. In this embodiment, the reservoir forming substrate 30 and the flow path forming substrate 10 are joined with an adhesive 35. The reservoir portion 31 of the reservoir forming substrate 30 is made to communicate with the communication portion 13 through a penetration portion 52 provided in the elastic film 50 and the insulator film 51. The reservoir 100 is formed with the reservoir portion 31 and the communication portion 13.

In a region facing the piezoelectric element 300 of the reservoir forming substrate 30, a piezoelectric element holding portion 32 is provided. The piezoelectric element 300 is formed in the piezoelectric element holding portion 32 and is protected in a state where the piezoelectric element 300 is hardly affected by the influence of the external environment. The piezoelectric element holding portion 32 may be or may not be sealed. As materials of such a reservoir forming substrate 30, glass, ceramic materials, metals, resin, and the like are mentioned, for example. It is preferable that the reservoir forming substrate 30 is formed with materials having almost the same coefficient of thermal expansion as that of the flow path forming substrate 10. In this embodiment, a silicon single crystal substrate which is the same material as the material of the flow path forming substrate 10 is used.

On the reservoir forming substrate 30, a connection wiring 200 formed with a predetermined pattern is provided. On the connection wiring 200, a drive circuit 210 for driving the piezoelectric element 300 is mounted. As the drive circuit 210, a circuit substrate, a semiconductor integrated circuit (IC), or the like can be used, for example. The tip portion of each lead electrode 90 drawn out from each piezoelectric element 300 to the outside of the piezoelectric element holding portion 32 and the drive circuit 210 are electrically connected through a drive wiring 220.

Onto the reservoir forming substrate 30, a compliance substrate 40 containing a sealing film 41 containing a material having flexibility, such as a PPS film and a fixation plate 42 containing a hard material, such as a metal material, is joined in a region facing the reservoir portion 31. The region facing the reservoir portion 31 of the fixation plate 42 forms an opening portion 43 in which the plate is completely removed in the thickness direction. Therefore, one surface of the reservoir portion 31 is sealed only by the sealing film 41 having flexibility.

The ink jet recording head configured as described above is configured so that ink is introduced from an external ink supply unit which is not illustrated, the inside of a space from the reservoir 100 to the nozzle opening 21 is filled with the ink, and then a voltage is applied between the lower electrode film 60 and the upper electrode film 80 corresponding to the pressure generating chamber 12 in accordance with a recording signal from the drive circuit 210 to deflectively deform the piezoelectric element 300 and the diaphragm to thereby increase the pressure in each pressure generating chamber 12, so that the ink can be discharged from the nozzle opening 21.

Hereinafter, a method for manufacturing the ink jet recording head having the above-described configuration is described with reference to FIGS. 3 to 7.

Figure 3A:
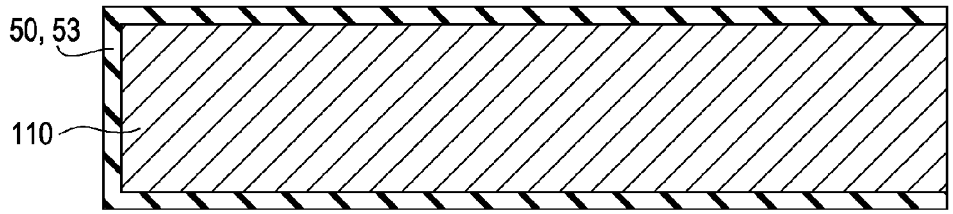
FIGS. 3A to 3D are views for explaining manufacturing processes of the ink jet recording head in the embodiment of the invention.

First, as illustrated in FIG. 3A, a flow path forming substrate wafer 110 which is a silicon wafer is thermally oxidized in a diffusion furnace having a temperature of about 1100° C. to thereby form a silicon dioxide film 53 constituting the elastic film 50 is formed on the surface of the wafer 110.

Figure 3B:
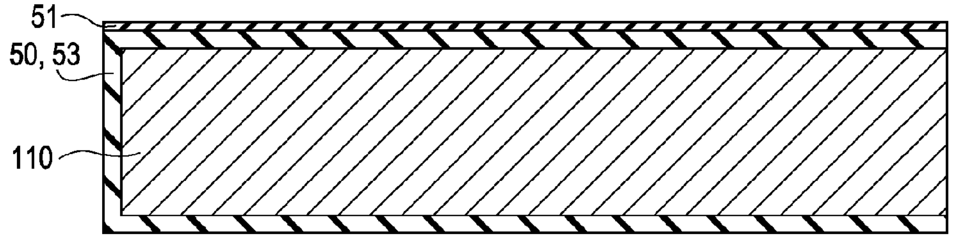

Next, as illustrated in FIG. 3B, the insulator film 51 containing zirconium dioxide is formed on the elastic film 50 (silicon dioxide film 53). Specifically, a zirconium (Zr) layer is formed on the elastic film 50 (silicon dioxide film 53) by, for example, a sputtering method or the like, and thereafter the zirconium layer is thermally oxidized in, for example, a diffusion furnace having a temperature of 500 to 1200° C. to thereby form the insulator film 51 containing zirconium dioxide ($ZrO_2$).

Figure 3C:
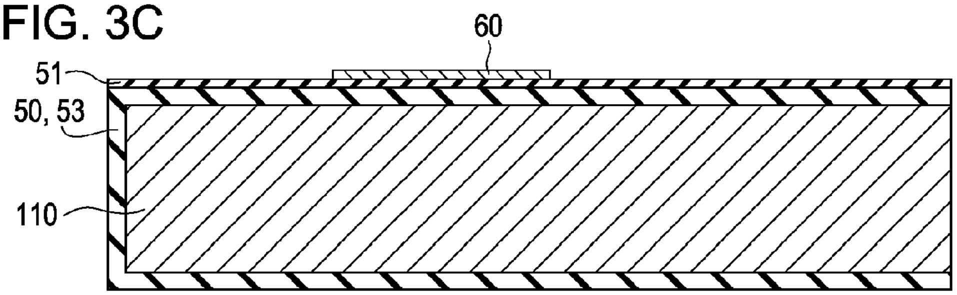

Subsequently, as illustrated in FIG. 3C, the lower electrode film 60 is formed by, for example, laminating platinum (Pt) and iridium (Ir) on the insulator film 51. Thereafter, the lower electrode film 60 is patterned into a predetermined shape.

Figure 3D:
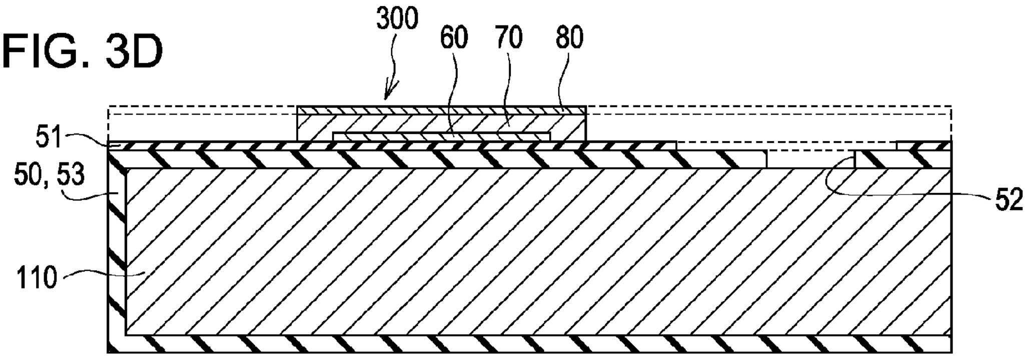

Next, as illustrated in FIG. 3D, the piezoelectric layer 70 containing lead zirconate titanate (PZT) or the like and, for example, the upper electrode film 80 containing iridium are formed on the entire surface of the flow path forming substrate wafer 110, and then the piezoelectric layer 70 and the upper electrode film 80 are patterned in a region facing each pressure generating chamber 12 to thereby form the piezoelectric element 300. After forming the piezoelectric element 300, the insulator film 51 and the elastic film 50 are patterned to thereby form a penetration portion 52, which penetrates the insulator film 51 and the elastic film 50 to expose the surface of the flow path forming substrate wafer 110, in a region where a communication portion (not illustrated) of the flow path forming substrate wafer 110 is to be formed.

As materials of the piezoelectric layer 70 constituting the piezoelectric element 300, ferroelectric piezoelectric materials, such as lead zirconate titanate (PZT), relaxor ferroelectrics in which metals, such as niobium, nickel, magnesium, bismuth, or yttrium, are added thereto, and the like are used, for example. The composition may be selected considering the properties, intended use, and the like of the piezoelectric element 300. Mentioned are, for example, $PbTiO_3$(PT), $PbZrO_3$(PZ), $Pb(Zr_xTi_{1-x})O_3$(PZT), $Pb(Mg_{1/3}Nb_{2/3})O_3$—$PbTiO_3$ (PMN-PT), $Pb(Zn_{1/3}Nb_{2/3})O_3$—$PbTiO_3$(PZN-PT), $Pb(Ni_{1/3}Nb_{2/3})O_3$—$PbTiO_3$(PNN-PT), $Pb(In_{1/2}Nb_{1/2})O_3$—$PbTiO_3$(PIN-PT), $Pb(Sc_{1/2}Ta_{1/2})O_3$—$PbTiO_3$(PST-PT), $Pb(Sc_{1/2}Nb_{1/2})O_3$—$PbTiO_3$(PSN-PT), $BiScO_3$—$PbTiO_3$ (BS-PT), $BiYbO_3$—$PbTiO_3$(BY-PT), and the like. A method for forming the piezoelectric layer 70 is not particularly limited. For example, in this embodiment, the piezoelectric layer 70 is formed using a so-called sol-gel method including applying and drying a so-called sol in which a metal organic substance is dissolved and dispersed in a catalyst to form a gel, and then firing the gel at a high temperature to thereby obtain the piezoelectric layer 70 containing metal oxide.

Figure 4A:
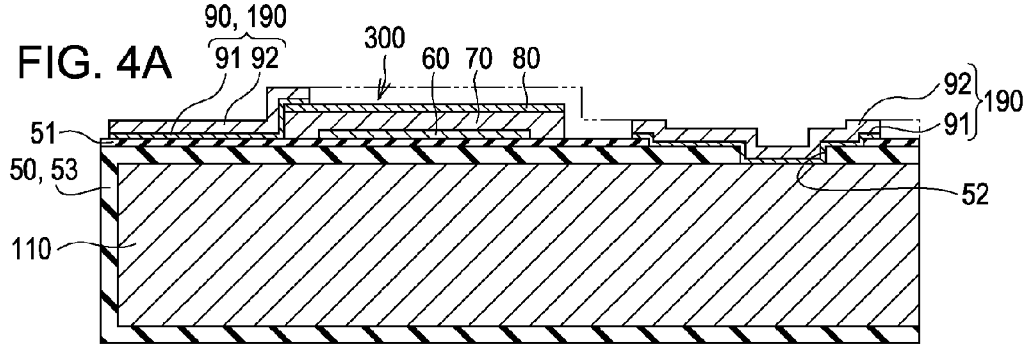
FIGS. 4A to 4C are views for explaining manufacturing process of the ink jet recording head in the embodiment of the invention.

Next, as illustrated in FIG. 4A, the lead electrode 90 is formed. Specifically, the metal layer 92 is first formed on the entire surface of the flow path forming substrate wafer 110 through the adhesion layer 91 to thereby form the wiring layer 190 containing the adhesion layer 91 and the metal layer 92. Then, a mask pattern (not illustrated) containing a resist or the like is formed on the wiring layer 190, for example. Then, the lead electrode 90 is formed by patterning the metal layer 92 and the adhesion layer 91 every piezoelectric element 300 through the mask pattern. In the process, the wiring layer (blocking film) 190 which is discontinuous with the lead electrode 90 is left in a region facing the penetration portion 52, so that the penetration portion 52 is sealed by the wiring layer 190.

The main materials of the metal layer 92 are not particularly limited insofar as the materials have a relatively high conductivity, For example, gold (Au), aluminum (Al), and copper (Cu) are mentioned, and gold (Au) is used in this embodiment. As materials of the adhesion layer 91, materials capable of securing the adhesiveness of the metal layer 92 may be acceptable. Specifically, titanium (Ti), a titanium tungsten compound (TiW), nickel (Ni), chromium (Cr), or a nickel chrome compound (NiCr) is mentioned, and the nickel chrome compound (NiCr) is used in this embodiment.

Figure 4B:
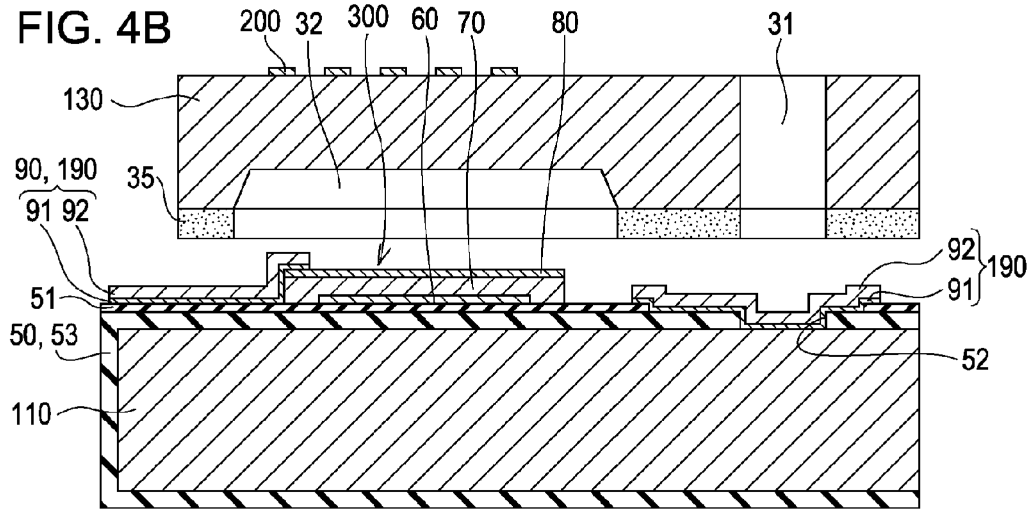

Next, as illustrated in FIG. 4B, a reservoir forming substrate wafer 130 is adhered onto the flow path forming substrate wafer 110 with the adhesive 35. Herein, the reservoir portion 31, the piezoelectric element holding portion 32, and the like are formed beforehand in the reservoir forming substrate wafer 130, and the connection wiring 200 described above is formed beforehand on the reservoir forming substrate wafer 130.

Figure 4C:
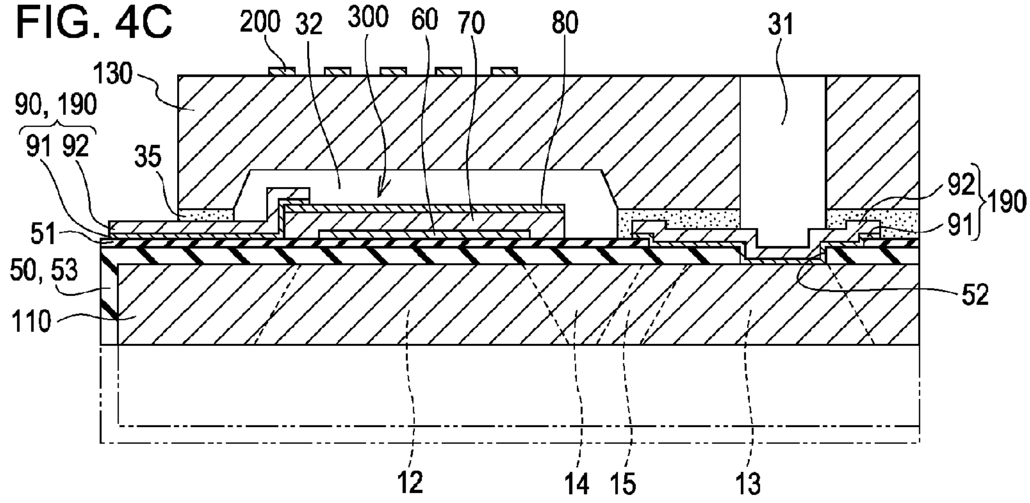

Subsequently, as illustrated in FIG. 4C, the flow path forming substrate wafer 110 is ground and polished until the thickness thereof reaches a certain thickness, and thereafter the flow path forming substrate wafer 110 is wet etched using fluoro nitric acid to thereby achieve a predetermined thickness to expose silicon (Si).

Next, as illustrated in FIGS. 5 and 6, the metal mask 19 having a predetermined shape containing the silicide film 16 which is formed by the silicidation of the surface to which silicon is exposed of the flow path forming substrate wafer 110 (metal mask formation process).

Figure 5A:
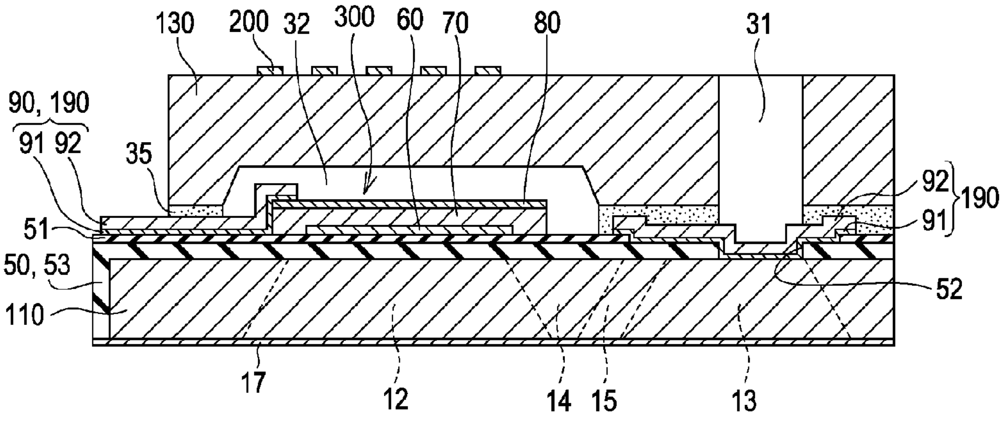
FIGS. 5A and 5B are views for explaining a metal mask formation process of the manufacturing processes of the ink jet recording head in the embodiment of the invention.

First, as illustrated in FIG. 5A, the metal film 17 whose surface is subjected to silicidation is formed on the flow path forming substrate wafer 110. Specifically, nickel (nickel) is formed into a film with a thickness of about 10 to 100 nm as the metal film 17 by a sputtering method, for example. The thickness of the metal film 17 is not required to be made uniform and may be adhered to the entire surface of the flow path forming substrate wafer 110.

As a sputtering method for forming the metal film 17 of this embodiment, an ECR (Electron Cyclotron Resonance: electron cyclotron resonance) sputtering method is employed. According to the ECR sputtering method, energy is applied to gas molecules to be made into plasma using microwaves, and then the plasma is rotated within a magnetic field and can be prevented from leaking to the outside, and therefore high-density plasma is obtained.

Figure 5B:
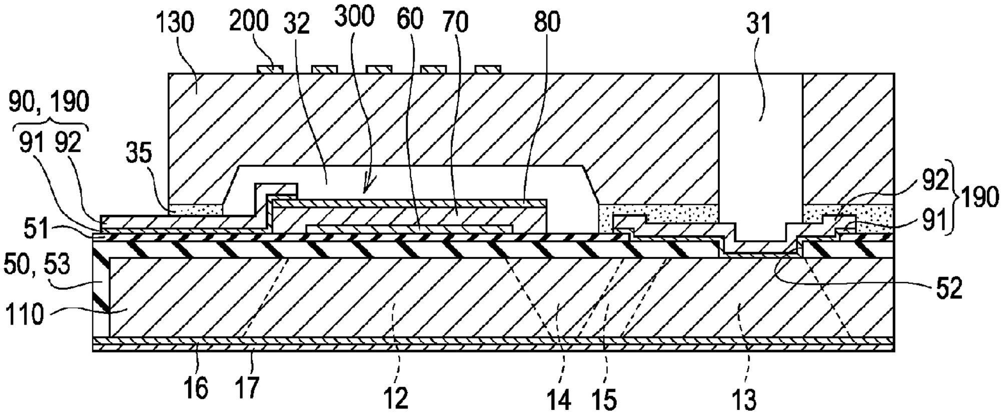

According to the sputtering method, metal components of the metal film 17 formed on the surface of the flow path forming substrate wafer 110 are diffused by the action of the high-density plasma on the surface containing silicon or silicon compounds (silicon dioxide and the like). Thus, due to the fact that nickel is diffused for silicidation, a nickel silicide film (silicide film 16) of a predetermined thickness (e.g., about 1 to 2 nm) is formed as illustrated in FIG. 5B (silicide film formation process).

The silicide film 16 having a thickness of about 1 to 2 nm which is formed during the sputtering can also be used as the mask. However, by further performing annealing treatment of about 100 to 400° C., nickel is further diffused to silicon, so that a thicker silicide film 16 can be formed. Even when using film forming methods other than the ECR sputtering method, e.g., a magnetron sputtering method or the like, by performing annealing treatment after the formation of the metal film 17, a silicide film having a predetermined thickness can be formed.

Figure 6A:
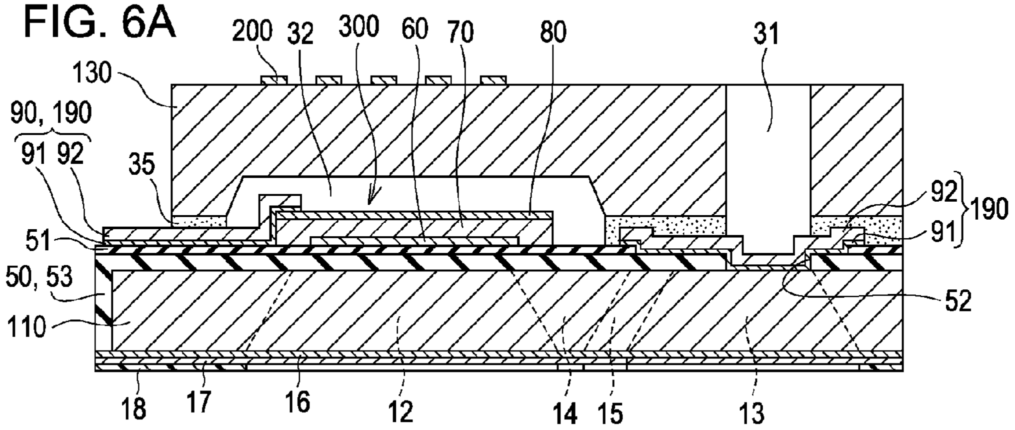
FIGS. 6A to 6C are views for explaining the metal mask formation process of the manufacturing processes of the ink jet recording head in the embodiment of the invention.

Next, as illustrated in FIG. 6A, a resist pattern 18 having a predetermined shape in accordance with the shape of the liquid flow path is formed by, for example, applying a resist onto the metal film 17. Specifically, a negative resist is applied onto the metal film 17 by a spin coating method or the like, and thereafter exposure, development, or the like is performed using a mask having a predetermined shape to thereby form the resist pattern 18 having a predetermined pattern, for example. It is a matter of course that a positive resist may be used in place of the negative resist.

Figure 6B:
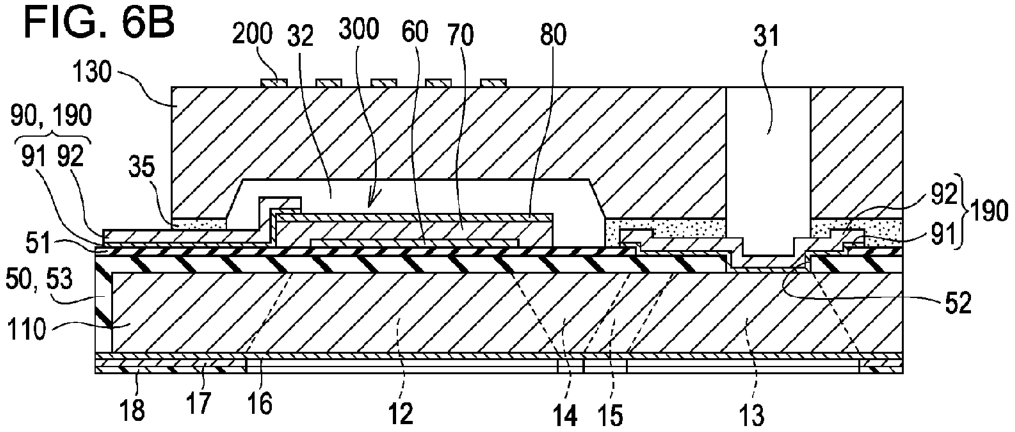

Next, as illustrated in FIG. 6B, the metal film 17 is wet etched using the resist pattern 18 as a mask to be patterned into a predetermined shape. More specifically, the metal film 17 is wet etched until the surface of the silicide film 16 is exposed. By the use of hydrochloric acid (HCl) or hydrofluoric acid (HF), for example, as an etchant for the etching, the metal film 17 containing nickel can be removed.

Figure 6C:
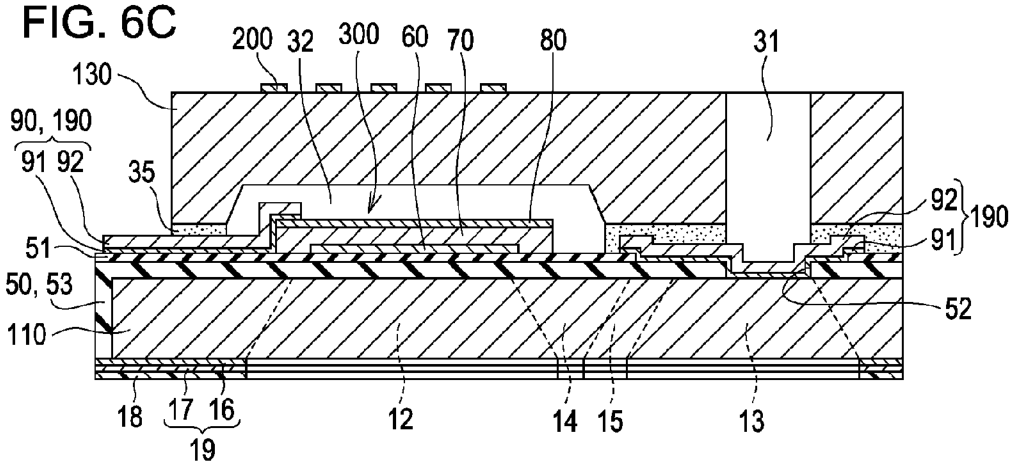

Subsequently, as illustrated in FIG. 6C, the silicide film 16 is patterned into a predetermined shape using the resist pattern 18 as a mask to thereby form the metal mask 19 containing the silicide film 16 and the metal film 17 (patterning process).

The silicide film 16 can be somewhat reduced by the wet etching using hydrofluoric acid (HF) or the like, for example, which is not realistic because the etching rate is low. So, in this embodiment, a reactive ion etching method (dry etching method) using carbon tetrafluoride ($CF_4$) is used as a technique for patterning the silicide film 16. Thus, the silicide film 16 which firmly combines with silicon with a molecular level can be patterned to thereby form the metal mask having a predetermined shape 19.

Figure 7A:
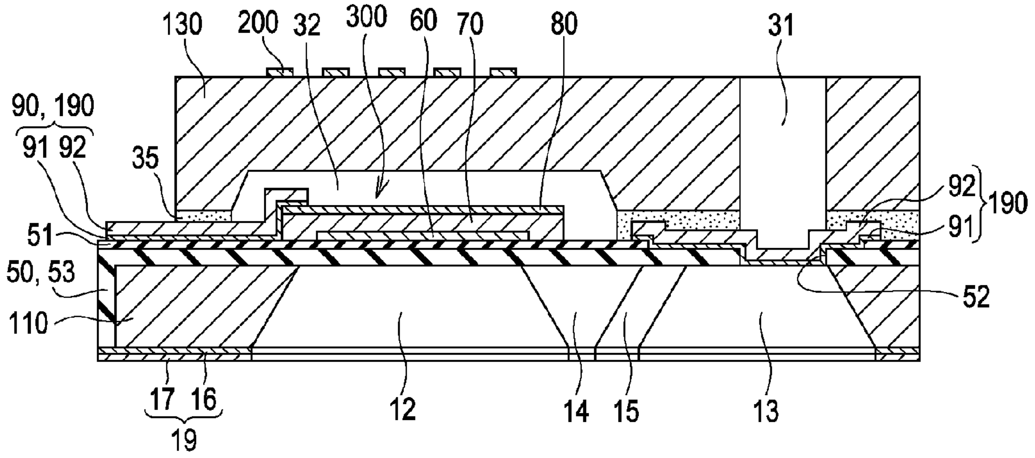
FIGS. 7A and 7B are views for explaining a liquid flow path formation process of the manufacturing processes of the ink jet recording head in the embodiment of the invention.

Next, as illustrated in FIG. 7A, by anisotropically etching the flow path forming substrate wafer 110 using the metal mask 19 as a mask after removing the resist pattern 18, a liquid flow path containing the pressure generating chamber 12, the ink supply path 14, the communication path 15, and the communication portion 13 is formed (liquid flow path formation process).

Specifically, by etching the flow path forming substrate wafer 110 using, for example, an alkaline etchant, such as a potassium hydrate (KOH) aqueous solution or TMAH (tetramethylammonium hydroxide) until the elastic film 50 and the adhesion layer 91 are exposed, the pressure generating chamber 12, the ink supply path 14, the communication path 15, and the communication portion 13 are simultaneously formed.

The metal mask 19 has the silicide film 16 containing nickel silicide. Since the silicide film 16 is formed between the metal film 17 and the flow path forming substrate wafer 110, i.e., between nickel (Ni) and silicon (Si), the bonding strength is firm with a molecular level. Therefore, side etching during anisotropic etching (wet etching) can be almost completely suppressed, so that high dimension accuracy can be obtained in the liquid flow path. Since the film thickness of the silicide film 16 is small and the silicide film 16 is patterned by a reactive ion etching method (dry etching method), higher dimension accuracy can be obtained. Moreover, the nickel silicide itself has alkali resistance and is dense, so that the thickness of the mask can be sharply reduced.

Figure 7B:
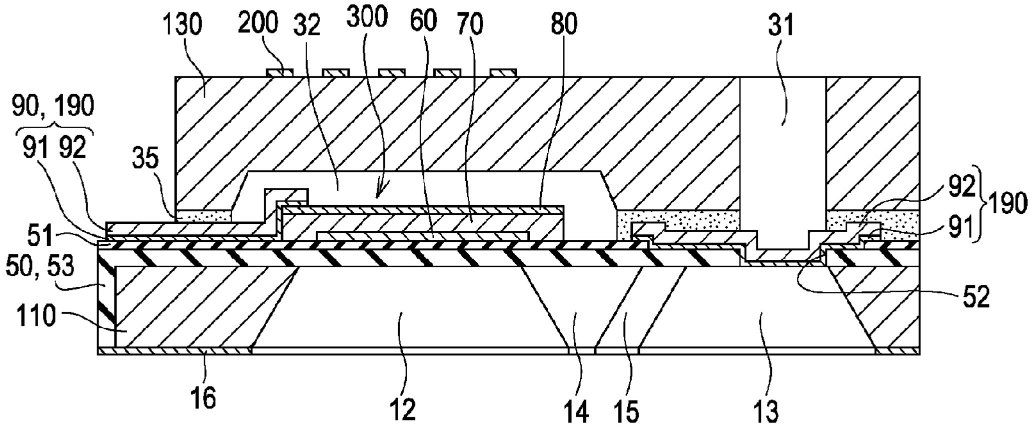

After the anisotropic etching, an unnecessary mask material is removed as illustrated in FIG. 7B.

In the case of performing anisotropic etching, the etching rate is as relatively small as about 1/180 not only in the (110) plane but in the (111) plane. However, when etching is performed, the mask film may remain in the shape of eaves. When the eaves-like mask film bends or is damaged, the mask film adheres as a foreign substance to the inner wall surface or the like of the liquid flow path. Therefore, in order to remove the eaves-like mask film generated after the anisotropic etching, wet etching is performed.

By the use of hydrochloric acid (HCl) or hydrofluoric acid (HF), for example, as an etchant for the etching, the mask material (metal film 17) can be removed by wet etching treatment for about 1 minute. Therefore, the time of the treatment for removing the mask material can be shortened and damages to the adhesive 35 which joins the flow path forming substrate wafer 110 and the reservoir forming substrate wafer 130 can be sharply reduced, so that the head quality can be improved.

By performing the etching using, for example, a spin etcher, liftoff removal of the eaves-like mask film can be almost completely performed. More specifically, this is because the silicide film 16 of the metal mask 19 is hard to be etched depending on the etchant but the thickness is as small as about several nanometers, and therefore the silicide film can be physically removed with the metal film 17 by the centrifugal force or the like of the etchant. In contrast, the silicide film 16 not having a shape of eaves has high bonding strength and remains on the surface of the flow path forming substrate wafer 110 even by performing the etching as illustrated in FIG. 7B. However, since the silicide film 16 is dense and thin, no problems arise in the bonding ability of the nozzle plate 20 and the like in the following processes. When removing the silicide film 16, the silicide film 16 can be completely removed by the use of the reactive ion etching method using carbon tetrafluoride described above.

Thereafter, the communication portion 13 and the reservoir portion 31 are made to communicate with each other to form the reservoir 100. Then, the drive circuit 210 is mounted on the connection wiring 200 formed on the reservoir forming substrate wafer 130 and simultaneously the drive circuit 210 and the lead electrode 90 are connected with the drive wiring 220. Subsequently, an unnecessary portion of the outer peripheral edge portion of the flow path forming substrate wafer 110 and the reservoir forming substrate wafer 130 is removed by cutting by dicing or the like, for example. Then, the nozzle plate 20 in which the nozzle openings 21 are formed is joined to a surface opposite to the reservoir forming substrate wafer 130 of the flow path forming substrate wafer 110 and simultaneously the compliance substrate 40 is joined to the reservoir forming substrate wafer 130. Then, by dividing the flow path forming substrate wafer 110 and the like into one chip size as illustrated in FIG. 1, the ink jet recording head having the above-described configuration is manufactured.

Therefore, according to this embodiment described above, by employing the method for manufacturing an ink jet recording head having the metal mask formation process for forming the metal mask 19 having a predetermined shape containing the silicide film 16 formed by the silicidation of the surface of the flow path forming substrate wafer 110 containing a silicon substrate and the liquid flow path formation process for forming the liquid flow path by anisotropically etching the flow path forming substrate wafer 110 using the metal mask 19 as a mask, side etching can be almost completely suppressed, high dimension accuracy can be obtained in the liquid flow path, and the mask removal treatment time can be shortened. Therefore, damages to the adhesive 35 can be reduced, so that the head quality can be improved.

As described above, a suitable embodiment of the invention is described with reference to the drawings but the invention is not limited to the embodiment. The shapes, combinations, and the like of the constituent components described in the embodiment described above are one example and can be variously altered based on design requirements and the like insofar as the embodiment does not deviate from the scope of the invention.

For example, the embodiment described above describes wet etching the metal film 17 by hydrochloric acid (HCl) or hydrofluoric acid (HF), and then dry etching the silicide film 16 by the reactive ion etching method using carbon tetrafluoride ($CF_4$) to pattern the metal mask 19. However, the invention is not limited thereto and both the layers can be removed at a time by the use of an ion milling method, for example.

Moreover, for example, the embodiment described above describes the nickel silicide as an example as the silicide film 16 of the metal mask 19. However, the invention is not limited thereto. Even when tungsten silicide which can be formed by forming tungsten (W) into a film, titanium silicide which can be formed by forming titanium (Ti) into a film, or cobalt silicide which can be formed by forming cobalt (Co) into a film, the same etching resistance as that of the nickel silicide is imparted, and therefore they can be employed as the metal mask 19.

In addition thereto, even when zirconium (Zr), hafnium (Hf), tantalum (Ta), chromium (Cr), iron (Fe), ruthenium (Ru), or molybdenum (Mo) is used, the silicidation of the silicon substrate surface can be performed.

Furthermore, in the embodiment described above, the ink jet recording head is described as an example of liquid ejecting heads. The invention is widely targeted to general liquid ejecting heads and it is a matter of course that the invention can be applied also to methods for manufacturing liquid ejecting heads which eject liquid other than ink. Mentioned as other liquid ejecting heads are, for example, various kinds of recording heads for use in image recording devices, such as printers, color material ejecting heads for use in the manufacturing of color filters of liquid crystal displays, electrode material ejecting heads for use in the formation of electrodes of organic EL displays, FED (Field Emission Display), and the like, biological organic material ejecting heads for use in the manufacturing of biochips, and the like.

What is claimed is:

1. A method for manufacturing a liquid ejecting head, comprising:

a metal mask formation process for forming a metal mask having a predetermined shape containing a silicide film formed by silicidation of a surface of a silicon substrate; and a liquid flow path formation process for forming a liquid flow path by anisotropically etching the silicon substrate by using the metal mask as a mask.

2. The method for manufacturing a liquid ejecting head according to claim 1, wherein the metal mask contains a nickel silicide film as the silicide film.

3. The method for manufacturing a liquid ejecting head according to claim 1, wherein the metal mask formation process has:

a silicide film formation process for forming a predetermined metal film on the surface of the silicon substrate to form the silicide film; and a patterning process for patterning the silicide film into a predetermined shape.

4. The method for manufacturing a liquid ejecting head according to claim 3, wherein, in the silicide film formation process, the metal film is formed by an electron cyclotron resonance sputtering method.

5. The method for manufacturing a liquid ejecting head according to claim 3, wherein, in the patterning process, the patterning is performed by a reactive ion etching method using carbon tetrafluoride as an etching gas.

* * * * *